United States Patent
Shin et al.

(10) Patent No.: US 10,407,614 B2
(45) Date of Patent: Sep. 10, 2019

(54) PHOTOCONVERSION FILM, AND PHOTOCONVERSION ELEMENT AND DISPLAY DEVICE COMPRISING SAME

(71) Applicant: LG CHEM, LTD., Seoul (KR)

(72) Inventors: Du Hyeon Shin, Daejeon (KR); Youkyong Seo, Daejeon (KR); Jungho Lim, Daejeon (KR); Ji Ho Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 169 days.

(21) Appl. No.: 15/546,194

(22) PCT Filed: Feb. 5, 2016

(86) PCT No.: PCT/KR2016/001321
§ 371 (c)(1),
(2) Date: Jul. 25, 2017

(87) PCT Pub. No.: WO2016/126143
PCT Pub. Date: Aug. 11, 2016

(65) Prior Publication Data
US 2018/0016490 A1  Jan. 18, 2018

(30) Foreign Application Priority Data
Feb. 6, 2015  (KR) .................. 10-2015-0018947

(51) Int. Cl.
| | |
|---|---|
| *C09K 11/02* | (2006.01) |
| *B32B 7/12* | (2006.01) |
| *B32B 27/08* | (2006.01) |
| *B32B 27/30* | (2006.01) |
| *C09K 11/06* | (2006.01) |
| *H01L 33/50* | (2010.01) |

(52) U.S. Cl.
CPC .............. *C09K 11/025* (2013.01); *B32B 7/12* (2013.01); *B32B 27/08* (2013.01); *B32B 27/306* (2013.01); *C09K 11/02* (2013.01); *C09K 11/06* (2013.01); *H01L 33/501* (2013.01); *H01L 33/507* (2013.01); *B32B 2250/40* (2013.01); *B32B 2307/402* (2013.01); *B32B 2307/412* (2013.01); *B32B 2307/7244* (2013.01); *B32B 2307/7265* (2013.01); *B32B 2457/20* (2013.01); *C09K 2211/1011* (2013.01); *H01L 33/502* (2013.01)

(58) Field of Classification Search
CPC ....... C09K 11/02; C09K 11/025; C09K 11/06; B32B 1/12; B32B 27/08; B32B 27/306; H01L 33/502; H01L 33/507
USPC ......................................................... 428/500
See application file for complete search history.

(56) References Cited

U.S. PATENT DOCUMENTS

| | | |
|---|---|---|
| 2003/0015689 A1 | 1/2003 | Tomoike et al. |
| 2005/0279248 A1 | 12/2005 | Auslander |
| 2013/0148057 A1 | 6/2013 | Kang et al. |
| 2015/0301257 A1 | 10/2015 | Choi et al. |

FOREIGN PATENT DOCUMENTS

| | | |
|---|---|---|
| JP | 2000-031531 A | 1/2000 |
| JP | 2007-127892 A | 5/2007 |
| JP | 2008-503643 A | 2/2008 |
| JP | 2011-013567 A | 1/2011 |
| JP | 4960645 B2 | 3/2012 |
| JP | 2013-079470 A | 5/2013 |
| KR | 10-0892377 B1 | 4/2009 |
| KR | 10-2013-0065608 A | 6/2013 |
| KR | 10-2014-0060218 A | 5/2014 |
| WO | 2014/119739 A1 | 8/2014 |

OTHER PUBLICATIONS

JP 49960645 machine translation (Year: 2012).*
KR 10-0892377 (Year: 2009).*
KR 10-2014-0060218 (Year: 2014).*

* cited by examiner

*Primary Examiner* — Edward J Cain
(74) *Attorney, Agent, or Firm* — Dentons US LLP (57) ABSTRACT

The present application relates to a light conversion film in which one or more types of organic fluorescent dyes are dispersed in a polymer medium including one or more types of ionic polymers, and a light conversion device, a backlight unit and a display apparatus including the same.

15 Claims, 6 Drawing Sheets

PHOTOCONVERSION FILM, AND PHOTOCONVERSION ELEMENT AND DISPLAY DEVICE COMPRISING SAME

This application is a National Stage Entry of International Application No. PCT/KR2016/001321, filed Feb. 5, 2016, and claims the benefit of Korean Application No. 10-2015-0018947, filed on Feb. 6, 2015, all of which are hereby incorporated by reference in their entirety for all purposes as if fully set forth herein.

FIELD OF THE INVENTION

The present disclosure relates to a light conversion film and a light conversion device including the same.

BACKGROUND OF THE INVENTION

Fluorescent substances are generally a light emitting material emitting light with a unique wavelength by absorbing energy in the form of light or electricity from the outside, and may be divided into inorganic fluorescent substances, organic fluorescent dyes, nanocrystal fluorescent substances and the like depending on the components forming the fluorescent substance and light emission mechanism.

Recently, attempts to modify a spectrum of a light source using such fluorescent substances have been diversely made. This relates to a fluorescent substance absorbing some of specific wavelengths of light coming out of a light source, converting this to light with a longer wavelength in a visible region and emitting the light, and depending on light emission properties of the fluorescent substance, brightness, color purity, color gamut and the like of the emitted light may be greatly enhanced.

An inorganic fluorescent substance is formed with a parent such as a sulfide, an oxide or a nitride, and activator ions, and may be used in high-quality display apparatuses since physical and chemical stability is excellent and high color purity is reproduced, however, there are disadvantages in that the fluorescent substance is very high-priced, has low light emission efficiency, and particularly, development of the fluorescent substance excited and emitting light in a near ultraviolet or blue region of 400 nm or higher is limited.

In a nanocrystal fluorescent substance formed with groups II to IV or groups III to V semiconductor particles having a few nanometer size, the fluorescence wavelength becomes different depending on the particle size unlike an organic fluorescent dye, and as the particle size decreases, light with a shorter wavelength emits, and a visible region having a target wavelength may all be expressed by controlling the size. In addition, the nanocrystal fluorescent substance has a larger absorption coefficient than general organic dyes by 100 times to 1000 times and also has high quantum efficiency, and thereby generates very strong fluorescence. Particularly, the nanocrystal fluorescent substance observes only a transition from a ground vibration state of a conduction band to a ground vibration state of a valence band, and as a result, the fluorescence wavelength mostly shows monochromatic light. However, there are disadvantages in that high raw material costs make it difficult to secure price competitiveness, and the fluorescent substance is weak against heat or oxygen.

On the contrary, an organic fluorescent dye has diverse light emission spectra compared to the inorganic fluorescent substances, has excellent quantum efficiency, and particularly has an advantage of being low-priced, and therefore, is well worth being used in a light conversion device. However, for increasing conversion efficiency of light passing through the organic fluorescent dye and intensity of the converted light, the concentration needs to be increased, and in this case, extinction caused by the concentration may not be avoided, and particularly, stability against heat or light is known to decrease. In view of the above, attempts to enhance stability by coating a gluing agent/adhesive on a light conversion film including an organic fluorescent dye and laminating a barrier film thereon have been made, however, there is a problem in that optical properties of the film decline due to the gluing/adhesive material, and the like.

PRIOR ART DOCUMENTS

Patent Documents

Korean Patent Application Laid-Open Publication No. 2000-0011622

SUMMARY OF THE INVENTION

Embodiments of the present disclosure are directed to providing a light conversion film capable of adhering to a barrier film without using a gluing agent/adhesive due to adhesive strength that the film has, and thereby stably maintaining optical properties of the film even under a high temperature and humidity condition, and having greatly enhanced heat resistance/moisture resistance, and a light conversion device including the same.

One embodiment of the present disclosure provides a light conversion film in which one or more types of organic fluorescent dyes are dispersed in a polymer medium including one or more types of ionic polymers.

The polymer medium may further include a nonionic polymer in addition to the ionic polymer. In the present specification, the ionic polymer, or the ionic polymer and the nonionic polymer may be referred to as a binder resin. As the binder resin, a photocurable resin, a thermosetting resin, a thermoplastic resin and the like may be used. According to one example, the polymer medium may include a cured material of a composition including, in addition to the binder resin including the ionic polymer, a polymerizable monomer and a polymerization initiator as necessary.

Another embodiment of the present application provides a light conversion device including one or more light conversion films in which one or more types of organic fluorescent dyes are dispersed in a polymer medium including one or more types of ionic polymers; and a barrier film provided on at least one surface of at least one of the light conversion films.

The light conversion film may be prepared by coating a composition for forming the light conversion film on the barrier film. In addition, the barrier film may be laminated on the light conversion film. With adhesive strength provided by the ionic polymer in the light conversion film, one surface of the barrier film may be laminated on the light conversion film without the aid of a gluing agent/adhesive.

The barrier film is capable of blocking external moisture and/or oxygen penetration, and permeability of at least one of moisture or oxygen may be $10^{-1}$ cc/m$^2$/day or lower. The barrier film may include a transparent substrate, and a barrier layer formed on one surface of the transparent substrate. The barrier layer is not particularly limited as long as it is capable of blocking moisture or oxygen, and those known in the art may be used. For example, the barrier layer may include aluminum oxides or nitrides, and ionic metal oxides providing a moisture or oxygen blocking property. The barrier layer may further include a buffer layer formed with one or more types selected from among sol-gel-based, acryl-based, epoxy-based and urethane-based coating solution compositions. As one example, the barrier film may include an organic-inorganic hybrid coating layer, an inorganic material layer and a protective coating layer including inorganic nanoparticles of which surfaces are modified with organosilane on one or both surfaces of a substrate. Herein, the inorganic material layer may be formed with metal oxides or nitrides. The inorganic nanoparticles may include nanoparticles of alumina, silica, zinc oxide, antimony oxide, titanium oxide or zirconium oxide. The organic-inorganic hybrid coating layer may be formed by curing a coating composition in a sol state including organosilane using heat or UV, and the coating solution composition in a sol state may include, together with the organosilane, proper additives, solvents, polymerization catalysts and the like as necessary.

According to another embodiment of the present application, the light conversion device may include the light conversion film in two or more layers. A plurality of the light conversion films may convert light entering from a light source to light each having a different wavelength (color), and in this case, the light conversion device may convert light entering from, for example, a light emitting diode (LED) to white light and emit the light.

According to another embodiment of the present application, the light conversion film may include light diffusion particles diffusing light entering from a light source inside the light conversion film. The light diffusion particles are dispersed into a polymer medium including one or more types of organic fluorescent dyes and one or more types of ionic polymers. The light conversion film including the light diffusion particles is capable of fluorescence diffusion as well as light diffusion, and may also be referred to as a light conversion fluorescence diffusion film. The light diffusion particles are for increasing light conversion efficiency of the light conversion film, and may include $TiO_2$ or silica nanoparticles, and materials known in the art may be used either alone as one type or as a mixture of two or more types. An average particle diameter of the light diffusion particles may be 50 nm or less. The light diffusion particles may be used in 0.5% by weight to 5% by weight with respect to a weight of the polymer medium.

According to another embodiment of the present application, the light conversion device may further include a light extraction plate extracting light entering from a light source, converted through the light conversion film and emitted. For example, a gluing/adhesive layer formed on the other surface of the barrier film provided with the light conversion film may be laminated with one surface of the light extraction plate. The light extraction plate may have a scattered structure on the surface or inside in order to enhance light extraction efficiency, or may include two or more types of materials having different refractive indexes inside. For example, the light extraction layer may be prepared by coating a composition including scattered particles and a binder on a transparent substrate, and drying or curing the result. When necessary, a planarization layer may be further provided on the coating layer including the scattered particles and the binder. As another example, the light extraction layer may be prepared by forming an unevenness structure on a transparent substrate through micro-embossing. When necessary, a planarization layer may be further provided on the unevenness structure.

DETAILED DESCRIPTION OF THE EMBODIMENTS

Hereinafter, embodiments described in the present specification will be illustrated with reference to the following examples. However, the following examples are for illustrative purposes only and not to limit the scope of the present disclosure.

Example 1

Figure 6:
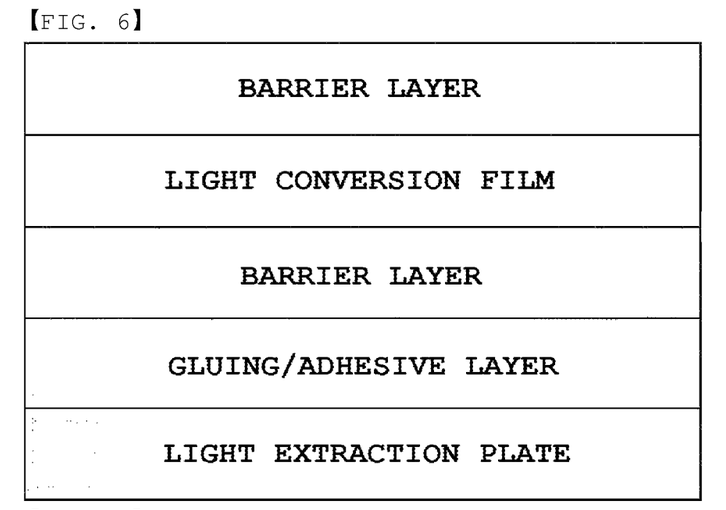
FIG. 6 illustrates structures of light conversion devices manufactured in Examples 1 and 2.

In 20 g of water, 1 g of polyvinyl alcohol (PVA) having a weight average molecular weight (Mw) of 85,000 to 124,000 and a degree of saponification of 87% was completely dissolved at a temperature of 150° C., and to the cooled solution, 4 g of polyethyleneimine (PEI) having a weight average molecular weight (Mw) of 10,000 and epichlorohydrin in 15% with respect to the PEI weight were added and dissolved at room temperature. To the composition, pyranine, a green fluorescent dye, was added in 0.3% with respect to the polymer weight (sum of PVA and PEI weights) of the composition to prepare a composition for forming a film. The composition for forming a film prepared using the above-mentioned method was coated on a barrier layer-formed barrier film using a wire bar, and thermosetting was induced while hot-air drying the result for 5 minutes in a 100° C. drying oven, and then a separate barrier film was laminated on the film. Lastly, a light extraction film was laminated on one surface of the barrier film to complete a green light conversion device having a structure as in FIG. 6.

Example 2

To 20 g of water, 1 g of polyallylamine (PAA) having a weight average molecular weight (Mw) of 65,000, 4 g of polyethyleneimine (PEI) having a weight average molecular weight (Mw) of 10,000, and epichlorohydrin in 15% with respect to the PEI weight were added and dissolved at room temperature, and to the composition, pyranine, a green fluorescent dye, was added in 0.3% with respect to the polymer weight (sum of PAA and PEI weights) of the composition to prepare a composition for forming a film. The composition for forming a film prepared using the above-mentioned method was coated on a barrier layer-formed barrier film using a wire bar, and thermosetting was induced while hot-air drying the result for 5 minutes in a 100° C. drying oven, and then a separate barrier film was laminated on the film. Lastly, a light extraction film was laminated on one surface of the barrier film to complete a green light conversion device having a structure as in FIG. 6.

Comparative Example 1

Figure 7:
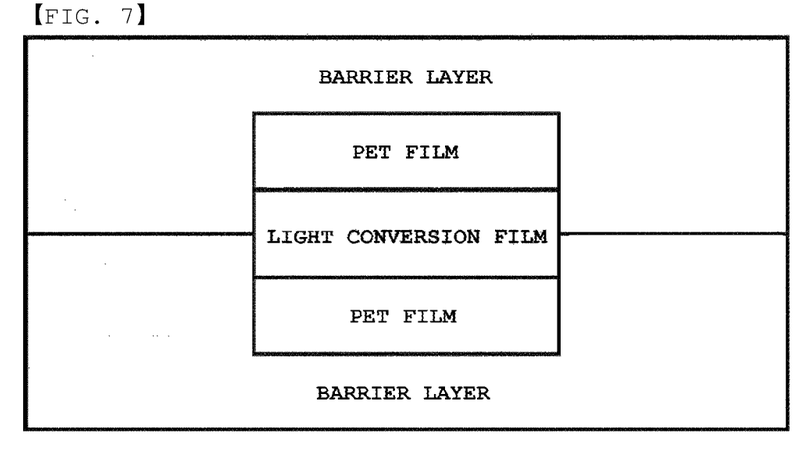
FIG. 7 illustrates structures of light conversion devices manufactured in Comparative Examples 1 and 2.

In 20 g of water, 1 g of polyvinyl alcohol (PVA) having a weight average molecular weight (Mw) of 85,000 to 124,000 and a degree of saponification of 87% was completely dissolved at a temperature of 150° C., and to the cooled solution, pyranine, a green fluorescent dye, was added in 0.3% with respect to the PVA weight to prepare a film composition solution. The film composition solution was coated on a barrier film in the same manner as in Example 1, and a separate barrier film was laminated thereon, however, the film was not attached. Hence, the composition for forming a film was coated on a PET film and a separate PET film was attached thereto, and then using a barrier film with an adhesive, the barrier film was laminated on both sides of the film to complete a light conversion device having a structure as in FIG. 7.

Comparative Example 2

In 20 g of water, 5 g of polyallylamine (PAA) having a weight average molecular weight (Mw) of 65,000 was completely dissolved at room temperature, and pyranine, a green fluorescent dye, was added in 0.3% with respect to the PAA weight to prepare a composition for forming a film. The composition for forming a film was coated on a barrier film in the same manner as in Example 1, and a separate barrier film was laminated thereon, however, the film was not attached. Hence, the film composition solution was coated on a PET film and a separate PET film was attached thereto, and then using a barrier film with an adhesive, the barrier film was laminated on both sides of the film to complete a light conversion device having a structure as in FIG. 7.

Figure 8:
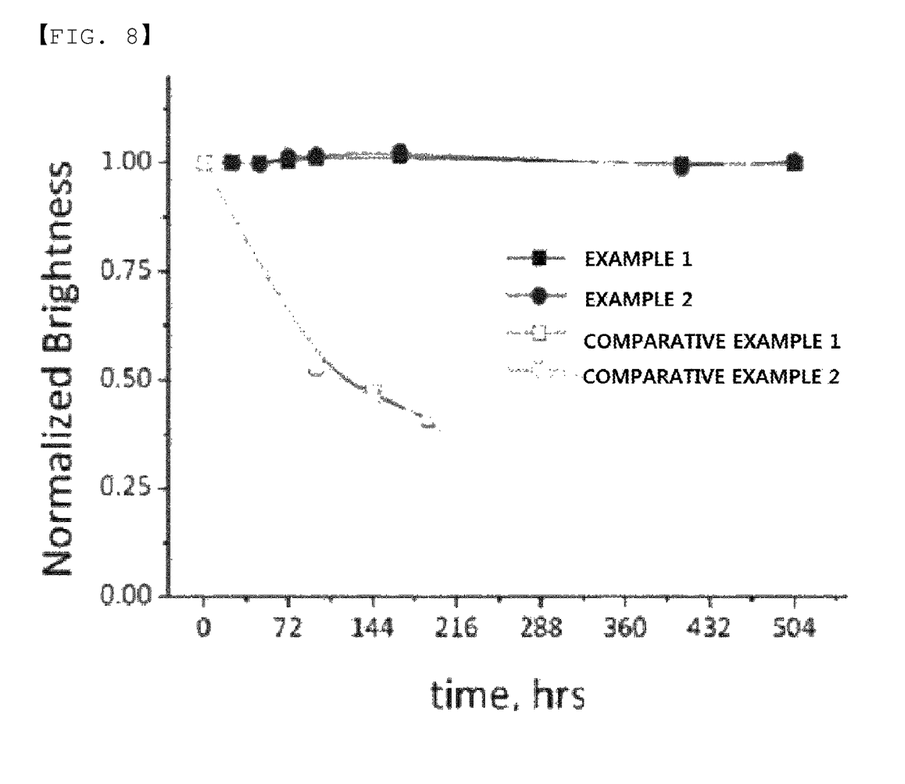
FIG. 8 shows durability measurement results on light conversion devices manufactured in Examples 1 and 2, and Comparative Examples 1 and 2.

In order to identify adhesive strength and an oxygen or moisture blocking effect of the barrier film obtained therefrom, the light conversion devices were placed in a thermos-hygrostat maintaining 85° C. temperature and 85% humidity, and changes in the brightness value of the film were observed over time. The observation results are shown in FIG. 8.

When a film was formed on a barrier film using a composition of the light conversion film provided by the present disclosure and a separate barrier film was laminated as described above, it was identified that fluorescence properties were stably maintained even under a high temperature and humidity condition.

Experimental Example

In order to test adhesive strength of the light conversion film according to one embodiment of the present specification, the surface of the barrier film laminated on the light conversion film was cross-cut in a line form such as a checkboard spaced 1 mm apart using a knife in accordance with the ASTM standard, then a cellophane tape was attached thereon, and adherence when removing the tape was determined. The results are shown in the following Table 1. ○ indicates being completely adhered, and X indicates space between the checkboard pattern being partially peeled-off or completely peeled-off.

TABLE 1

| Category | | Adhesion |
|---|---|---|
| Example | Example 1 | ○ |
| | Example 2 | ○ |
| Comparative Example | Comparative Example 1 | X |
| | Comparative Example 2 | X |

As shown in Table 1, the light conversion film according to one embodiment of the present specification had the desired effect in the adhesive property compared to the comparative examples that did not include an ionic polymer.

Hereinafter, embodiments of the present disclosure will be described in more detail with reference to the accompanying drawings.

The light conversion film according to one embodiment of the present application has one or more types of organic fluorescent dyes dispersed in a polymer medium including one or more types of ionic polymers.

The light conversion film according to embodiments described in the present specification performs a role of converting light entering from a light source including light with a wavelength selected in a region from near-ultraviolet to visible to light with a specific wavelength (color). In addition, the light conversion film performs a role of converting light entering from an LED light source to white light and emitting the light.

Herein, the light conversion film may include an organic fluorescent dye capable of exhibiting excellent color purity and color gamut. The organic fluorescent dye may use a dye absorbing light with a wavelength selected in a region from near-ultraviolet to visible, and emitting light having a wavelength different from the absorbed light. For example, as the organic fluorescent dye, a green light emitting fluorescent dye having a maximum light emission wavelength between 500 nm to 550 nm and/or a red light emitting fluorescent dye having a maximum light emission wavelength between 600 nm to 660 nm may be used either in one type each, or two or more types at the same time.

Although not particularly limited thereto, the organic fluorescent dye preferably includes acridine-based, xanthene-based, arylmethane-based, coumarin-based, polycyclic aromatic hydrocarbon-based, polycyclic heteroaromatic-based, perylene-based, pyrrole-based, pyrene-based derivatives and the like. These materials are one example of the organic fluorescent dye, and various other organic fluorescent dyes may be used in addition thereto. Preferably, organic fluorescent dyes having a full width at half maximum (FWHM) of 60 nm or less in a film state and molecular absorption coefficient of 50,000 $M^{-1}cm^{-1}$ to 150,000 $M^{-1}cm^{-1}$ of may be used, however, the organic fluorescent dye is not limited thereto. In the present specification, the full width at half maximum means, when converting light absorbed from an external light source to light with a different wavelength for emitting, a light emission peak width at the half of the maximum height in the maximum light emission peak of the emitted light. In the present specification, the full width at half maximum is measured in a film state. The full width at half maximum of a light emission peak in a film state of an organic fluorescent dye means measuring by irradiating light to a state prepared in a film form instead of a solution state by using the organic fluorescent dye alone or mixing with other components that do not affect full width at half maximum measurements. More preferably, all fluorescent dyes dissolved in polar solvents may be used, and cationic or anionic organic fluorescent dyes may be more preferably used although they are not divided into cationic, anionic and neutral dyes.

The light conversion film may be a polymer film including the organic fluorescent dye and, when necessary, light diffusion particle-dispersed one or more types of ionic polymers. For example, the light conversion film may include a cured material of a composition including the organic fluorescent dye and/or light diffusion particles, a binder resin including one or more types of ionic polymers, and as necessary, a polymerizable monomer or a polymerization initiator.

As the binder resin, a photocurable resin, a thermosetting resin, a thermoplastic resin and the like may be used, and a water-soluble polymer is preferably used. The binder resin may be used either alone in one type, or two or more types thereof may be used together.

In the present disclosure, the ionic polymer may refer to a case including ionic bonds inside the polymer chain. In addition, the ionic polymer may refer to a case having many functional groups bonding to ionic solutes in the monomers, and may also be referred to as an electrolyte polymer.

The ionic polymer means a polymer exhibiting anionic or cationic properties when dissociated in water. Examples of a cationic polymer includes polymers having an amine group as a functional group, and the cationic polymer has a property of having a positive charge when dissolved in water by bonding to surrounding hydrogens. Examples of a functional group of an anionic polymer include a carboxylic group, a phosphoric group or a silicic group.

When a proper reactive monomer or a polymerization initiator is added, the ionic polymer such as a cationic polymer or an anionic polymer forms a film having a network structure through not only a reaction with a nonionic polymer such as polyvinyl alcohol or polyallylamine, but also a reaction between the ionic polymers. Adhesive strength with the barrier film is provided therethrough.

In addition thereto, the ionic polymer may contribute to stabilization of the organic fluorescent dye. For example, when using an anionic fluorescent dye and adding a cationic polymer, ionic bonds are formed by these pairing with each other, and the organic fluorescent dye performs a role of maintaining a stable state in which fluorescent properties are exhibited in the polymer medium.

The ionic polymer is not particularly limited, and polyacrylamide, polyacrylic acid, poly(silicic acid), poly(phosphoric acid), poly[3-(vinyloxy)propane-1-sulfonic acid)], poly(ethylenephosphoric acid), poly(maleic acid), poly(2-methacryloyloxyethane-1-sulfonic acid, poly(3-methacryloyloxypropane-1-sulfonic acid, polyethyleneimine, polyamine, polyamideamine, polydiallydimethyl ammonium chloride, poly(4-vinylbenzyltrimethylammonium salt), poly[(dimethylimino)trimethylene(dimethylimino) hexamethylene dibromide], poly(2-vinylpiperidine salt), poly(4-vinylpiperidine salt), poly(vinylamine salt), poly(2-vinylpyridine), normal alkyl(quaternary) derivatives and the like may be used, however, the ionic polymer is not limited thereto.

As the nonionic polymer, poly(vinyl alcohol), polyallyamine and the like may be used, however, the nonionic polymer is not limited thereto. As the polyallylamine, polyallylamine (PAA) or polyallylamine hydrochloride (PAH) may be used.

According to one example, the composition for preparing a light conversion film according to embodiments of the present specification includes an organic fluorescent dye, and as necessary, light diffusion particles, a binder resin, a polymerizable monomer and a polymerization initiator, and the binder resin includes an ionic polymer and a nonionic polymer. The ionic polymer may be used in 50% to 1,000% with respect to the nonionic polymer weight. The polymerizable monomer may be used in 10% to 30% with respect to the ionic polymer weight. The organic fluorescent dye may be used in 0.001% to 5% with respect to the nonionic polymer weight. The amount of the polymerization initiator may be determined as necessary, and may be from 0.01% by weight to 20% by weight with respect to the solid weight of the whole composition. The composition for preparing a light conversion film may further include a solvent as necessary, and for example, water may be used as the solvent when the binder resin including the ionic polymer is water-soluble. The composition for preparing a light conversion film is preferably dissolved in the solvent, for example, water, so that the solid content becomes 10% by weight to 40% by weight in the whole composition solution.

The nonionic polymer such as polyvinyl alcohol (PVA) or polyallylamine (PAA) may become a main material forming the composition for forming a light conversion film, and the content of the remaining components may be measured based on the weight of the polyvinyl alcohol or the polyallylamine. The polyvinyl alcohol is polyvinyl alcohol having a weight average molecular weight (Mw) of 85,000 to 146,000, and is preferably hydrolyzed to 96% or lower. The polyallylamine preferably has a weight average molecular weight (Mw) of 58,000 to 900,000.

In the present specification, the ionic polymer is an important component providing, together with the nonionic polymer, adhesive strength to the light conversion film according to embodiments of the present disclosure by producing a crosslinking reaction. The ionic polymer preferably has a weight average molecular weight (Mw) of 1,300 to 25,000. The ionic polymer having such a molecular weight range is advantageous in providing adhesive strength by forming a network structure between the ionic polymers, and also has a stabilization effect obtained by the organic fluorescent dye being adsorbed to the ionic group. When the molecular weight is too large, there is a problem in the preparation of the film. The ionic polymer is included in 50% to 1,000% and preferably in 100% to 600% with respect to the nonionic polymer weight. When the ionic polymer is included in less than 100% of the nonionic polymer weight, adhesion between the barrier film and the film becomes poor causing a problem of the barrier film being peeled-off. When the ionic polymer is included in greater than 600% with respect to the nonionic polymer weight, a problem of coating property decline may occur.

In order to induce a crosslinking reaction between the nonionic polymer and the ionic polymer and to increase adhesion, a polymerizable monomer is preferably included. The polymerizable monomer is included 10% to 30% and preferably in 15% to 25% with respect to the ionic polymer weight. When the polymerizable monomer is included in less than 1% with respect to the ionic polymer weight, a problem of reducing adhesive strength with the barrier film may occur. When the polymerizable monomer is included in greater than 30% with respect to the ionic polymer weight, a curing reaction is progressed even at room temperature causing a problem of significantly reducing stability and coatability of the composition for forming a light conversion film. A most preferred content of the polymerizable monomer is 20% with respect to the ionic polymer weight. As the polymerizable monomer, glycidyls are more preferred, and although not limited thereto, aldehydes, dialdehydes, isocynates, alcohols and the like may be used.

Figure 1:
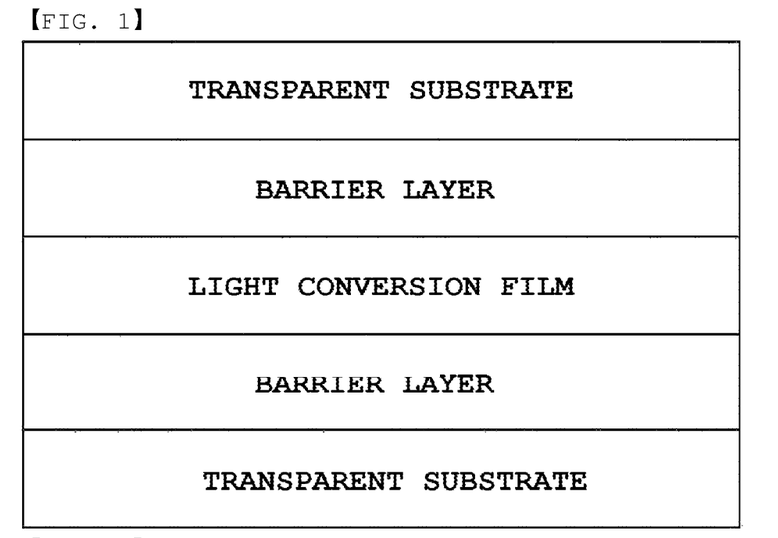
FIG. 1 to FIG. 5 illustrate lamination structures of a light conversion device according to embodiments of the present application.

FIG. 1 illustrates a light conversion device according to one embodiment of the present application, and a barrier film including a transparent substrate and a barrier layer is provided on both sides of a light conversion film. Herein, the barrier layer of the barrier film is disposed adjoining the light conversion film.

The light conversion device according to FIG. 1 may be formed by coating a composition for a light conversion film, for example, a composition including one or more types of organic fluorescent dyes, and as necessary, light diffusion particles, a binder resin including one or more types of ionic polymers, a polymerizable monomer and a polymerization initiator, on a barrier film including a transparent substrate and a barrier layer, curing or drying the result as necessary to prepare a light conversion film, and then laminating a barrier film including a transparent substrate and a barrier layer on the light conversion film. Herein, lamination of the light conversion film and the barrier film may be carried out without the aid of a separate gluing agent or adhesive due to the presence of the ionic polymer. When curing is carried out after coating the composition, the curing method and condition may be determined depending on the types of the binder resin including the ionic polymer or other components. The transparent substrate may include a resin such as PET, but is not limited thereto, and transparent plastic films or substrates known in the art may be used. In FIG. 1, the light conversion film is illustrated in one layer, however, two or more layers of the light conversion films may be laminated as necessary.

Oxygen and moisture permeability of the barrier layer may each be, for example, $10^{-1}$ cc/m$^2$/day or less. This is one example of the barrier film, and oxygen and moisture permeability of the barrier layer may have different values.

Figure 2:
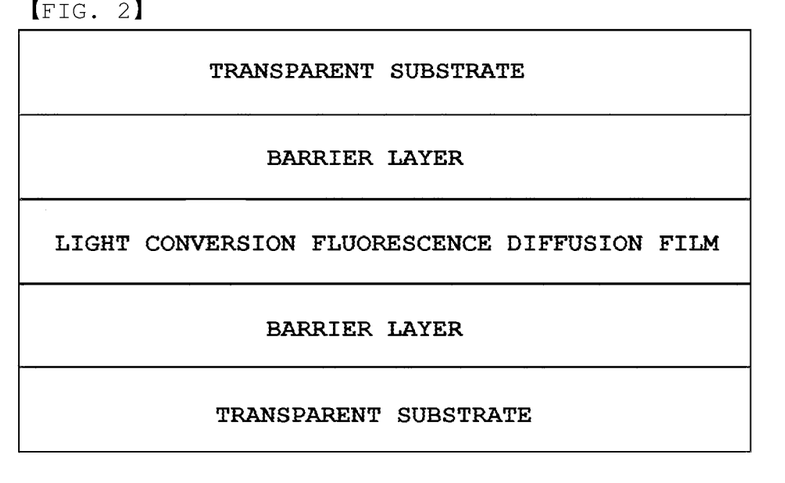

In a light conversion device according to FIG. 2, the light conversion film is a light conversion fluorescence diffusion film including one or more types of light diffusion particles. In other words, a light conversion film included in FIG. 2 includes one or more types of organic fluorescent dyes, one or more types of light diffusion particles and a polymer medium including one or more types of ionic polymers. The light diffusion particles perform a role of diffusing light entering from a light source inside the light conversion film. Herein, the light diffusion particles may include $TiO_2$ or silica particles, but are not limited thereto. As for the barrier film including a transparent substrate and a barrier layer, the organic fluorescent dye, the polymer medium and the like, the descriptions provided above may be used.

Figure 3:
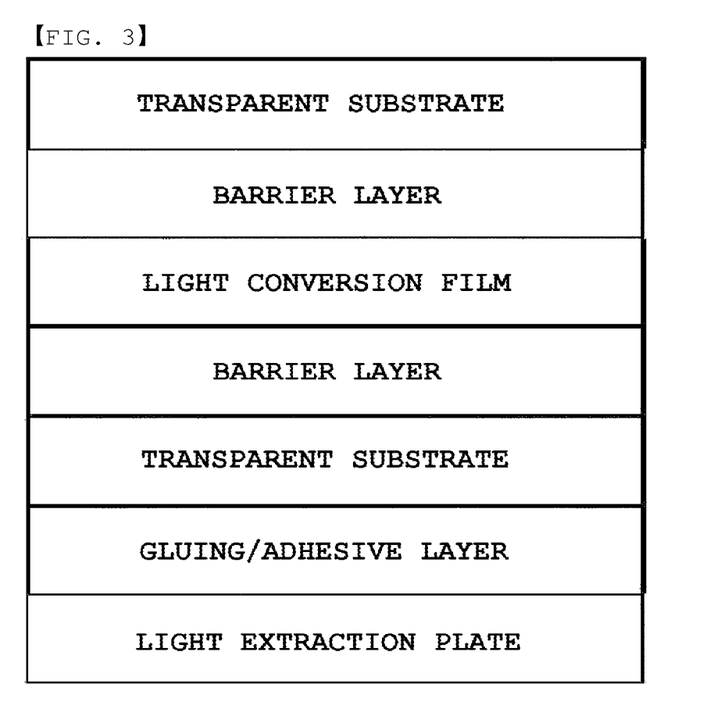

A light conversion device according to FIG. 3 further includes a light extraction plate. Specifically, in a structure laminating a barrier film including a transparent substrate and a barrier layer on both surfaces of a light conversion film, a gluing layer or an adhesive layer is provided on a surface of any one of the barrier films opposite to the surface facing the light conversion film, and a light extraction plate is attached hereto. The light extraction plate is for enhancing conversion efficiency of the light conversion film, and is not particularly limited as long as it is known in the art.

Figure 4:
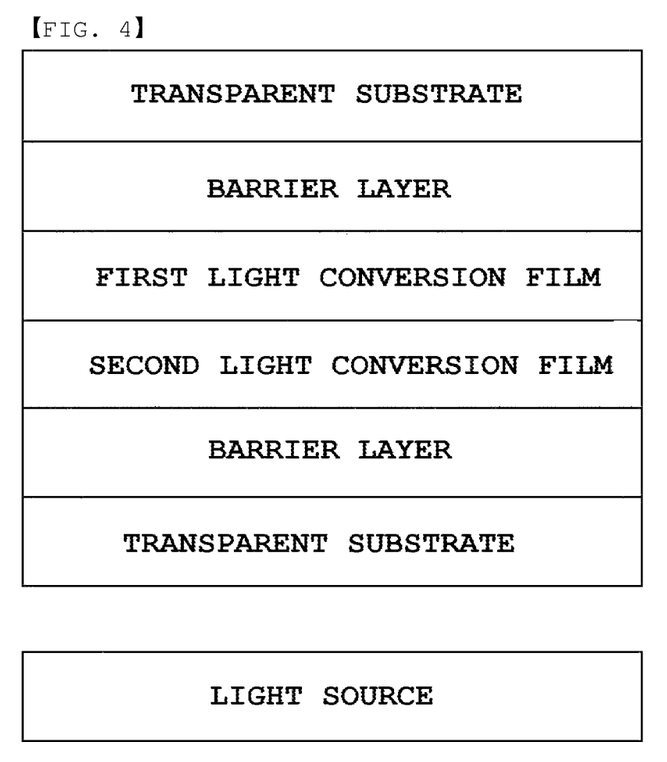

Meanwhile, FIG. 4 illustrates a structure of a light conversion device in which a plurality of light conversion films are consecutively disposed. Specifically, the light conversion device includes a barrier film including a transparent substrate and a barrier layer formed on the transparent substrate; a first light conversion film in which a first organic fluorescent dye and, as necessary, light diffusion particles are dispersed into a polymer medium including one or more types of ionic polymers coated on the barrier film; and a second light conversion film in which a second organic fluorescent dye and, as necessary, light diffusion particles are dispersed into a polymer medium including one or more types of ionic polymers prepared in the same manner on the first light conversion film. As illustrated in FIG. 4, the second light conversion film may be directly laminated on the first light conversion film, and in this case, the aid of a gluing agent or an adhesive is not required due to the presence of the ionic polymer. However, the scope of the present disclosure is not limited to FIG. 4, and the first light conversion film and the second light conversion film may be disposed apart from each other. In this case, other additional films may be provided between the first light conversion film and the second light conversion film. In addition, in FIG. 4, a structure including two light conversion films is illustrated, however, three or more light conversion films may be laminated as necessary.

Figure 5:
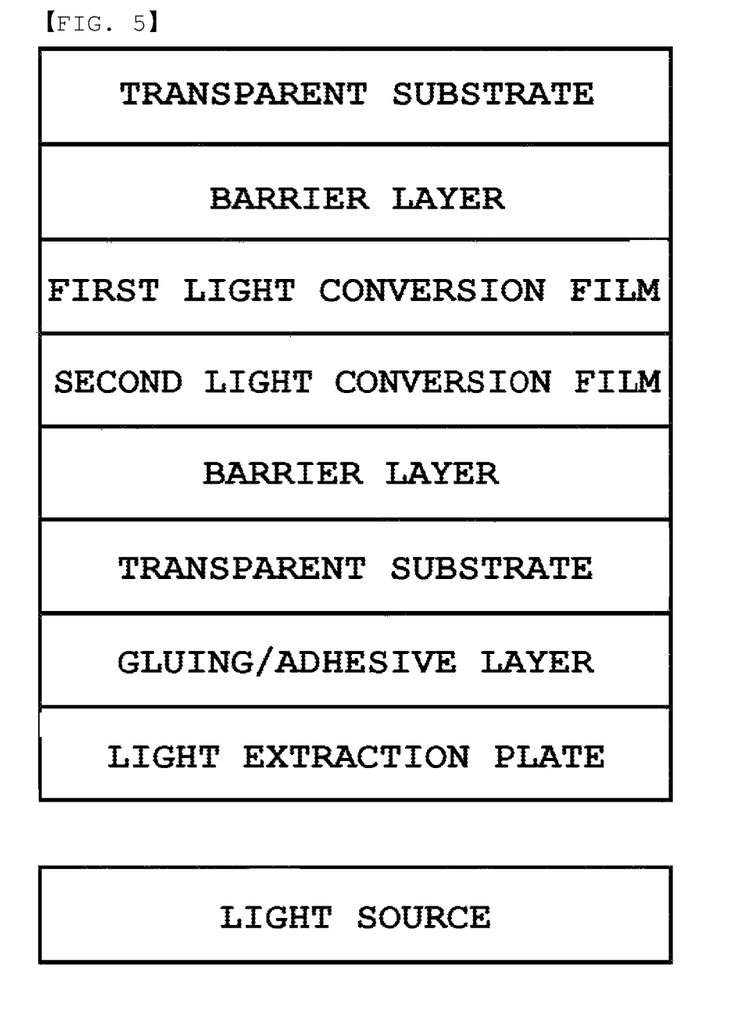

A light conversion device including a plurality of light conversion films as in FIG. 4 may also further include a light extraction plate attached through a gluing layer or an adhesive layer as in FIG. 3, and such a structure is illustrated in FIG. 5. By further including such a light extraction plate, conversion efficiency of the light conversion film may be further enhanced.

According to one example, a plurality of the light conversion films may be, for example, disposed so as to have a longer light emission wavelength as being further away from a light source, and for example, the first and the second light conversion films may be red and green light conversion films, respectively. As a result, light absorbed from a monochromatic LED light source may be converted to white light while passing through a plurality of the light conversion films. The disposition of a plurality of the light conversion films are for illustrative purposes only, and the disposition and/or the structure of each of the light conversion films for increasing conversion efficiency are not particularly limited as long as they are known in the art.

Another embodiment of the present application provides a backlight unit including the light conversion device according to the embodiments described above. The backlight unit may have constitutions known in the art except for the light conversion device. For example, the backlight unit may include an edge-type light source; a light guide plate diffusing light received from the edge-type light source; and the light conversion device provided on one surface of the light guide plate. As another example, the backlight unit may include a direct-type light source and the light conversion device provided on one surface of the direct-type light source. A reflecting plate may also be provided on a surface of the light guide plate opposite to the surface facing the light conversion device, and a light concentrating sheet, a brightness enhancing sheet and the like may be additionally provided on a side of the light conversion device opposite to the surface facing the light source or the light guide plate.

Another embodiment of the present application provides a display apparatus including the backlight unit. The display apparatus may have constitutions known in the art except for the light conversion device included in the backlight unit. For example, a display module provided on one surface of the backlight unit may be included. The display module may be a liquid crystal module including a thin film transistor and a color filter.

According to embodiments of the present disclosure, adhesion with a barrier film is excellent due to adhesive strength of a light conversion film itself provided by a curing reaction of an ionic polymer, and external moisture or oxygen penetrating into the film/fluorescence diffusion film can be effectively blocked. As a result, optical properties such as light emission wavelength, full width at half maximum (FWHM) and conversion efficiency can be maintained unvaringly when light entering to the light conversion film is converted to a specific wavelength (color), and useful life greatly increases. Accordingly, when using a light conversion film including two or more types of organic fluorescent dyes having different light emission wavelengths such as green and red, and converting light entering from a monochromatic LED light source to white light, brightness and color coordinates of the white light can be constantly maintained.

What is claimed is:

1. A light conversion film, wherein one or more types of water-soluble organic fluorescent dyes are dispersed in a polymer medium including one or more types of ionic polymers and one or more types of nonionic polymers, and the organic fluorescent dye has a full width at half maximum (FWHM) of 60 nm or less and a molecular absorption coefficient of 50,000 $M^{-1}cm^{-1}$ to 150,000 $M^{-1}cm^{-1}$.

2. The light conversion film of claim 1 comprising one, two or more types of at least one of a green light emitting fluorescent dye having a maximum light emission wavelength between 500 nm to 550 nm and a red light emitting fluorescent dye having a maximum light emission wavelength between 600 nm to 660 nm.

3. The light conversion film of claim 1, wherein the nonionic polymer includes at least one of polyvinyl alcohol (PVA) and polyallylamine (PAA).

4. The light conversion film of claim 1, wherein the ionic polymer is included in 50% to 1,000% with respect to a weight of the nonionic polymer.

5. The light conversion film of claim 1, wherein the polymer medium includes a cured material of a composition including a binder resin including the ionic polymer, a polymerizable monomer and a polymerization initiator.

6. The light conversion film of claim 5, wherein the polymerizable monomer is included in 10% to 30% with respect to a weight of the ionic polymer.

7. The light conversion film of claim 1, further comprising light diffusion particles dispersed into the polymer medium.

8. A light conversion device comprising:
the light conversion film of claim 1; and
a barrier film provided on at least one surface of at least one of the light conversion films.

9. The light conversion device of claim 8, wherein the barrier film is provided on both surfaces of the light conversion film, and the barrier film provided on one surface is laminated by forming the light conversion film through coating a composition for forming the light conversion film on the barrier film, and the barrier film provided on the other surface is laminated by attaching the barrier film on the light conversion film using adhesive strength of the light conversion film.

10. The light conversion device of claim 8, wherein the barrier film has moisture or oxygen permeability of $10^{-1}$ cc/m²/day or less.

11. The light conversion device of claim 8, wherein the barrier film includes a transparent substrate and a barrier layer provided on the transparent substrate.

12. The light conversion device of claim 8 comprising the light conversion film in two or more layers.

13. The light conversion device of claim 12, wherein the two or more light conversion films include an organic fluorescent dye converting incident light to light having different wavelengths.

14. The light conversion device of claim 13, wherein the two or more light conversion films are disposed so as to have a longer light emission wavelength as being further away from a light source.

15. The light conversion device of claim 8, further comprising a light extraction plate attached to a surface of at least one of the barrier films opposite to the surface facing the light conversion film through a gluing layer or an adhesive layer.

* * * * *